(12) United States Patent
Higuchi (10) Patent No.: US 9,918,033 B2
(45) Date of Patent: Mar. 13, 2018

(54) SIGNAL PROCESSING APPARATUS AND SIGNAL PROCESSING METHOD, AND IMAGE CAPTURING APPARATUS

(71) Applicant: CANON KABUSHIKI KAISHA, Tokyo (JP)

(72) Inventor: Daisuke Higuchi, Nagareyama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/446,833

(22) Filed: Mar. 1, 2017

(65) Prior Publication Data
US 2017/0257592 A1    Sep. 7, 2017

(30) Foreign Application Priority Data

Mar. 2, 2016 (JP) ................. 2016-040441

(51) Int. Cl.
*H03M 1/50* (2006.01)
*H04N 5/378* (2011.01)
(Continued)

(52) U.S. Cl.
CPC ......... *H04N 5/378* (2013.01); *H04N 5/23245* (2013.01); *H04N 5/357* (2013.01);
(Continued)

(58) Field of Classification Search
CPC ............ H03M 1/56; H03M 1/50; H03M 1/00; H03M 1/123; H03M 1/0609; H03M 1/1019; H03M 1/1225; H03M 1/14; H03M 1/144; H03M 1/186; H03M 1/22; H03M 1/52; H04N 5/378; H04N 5/3765; H04N 5/357; H04N 5/3575; H04N 5/243; H04N 5/343; H04N 5/35572; H04N 5/21; H04N 5/2256; H04N 5/23203; H04N 5/23245;
(Continued)

(56) References Cited

U.S. PATENT DOCUMENTS 8,040,269 B2 * 10/2011 Bogaerts ............... H03M 1/123
341/155
8,203,477 B2 *  6/2012 Lee ..................... H03M 1/1225
323/222

(Continued)

FOREIGN PATENT DOCUMENTS

JP    2013-236362 A    11/2013

*Primary Examiner* — Linh Nguyen
(74) *Attorney, Agent, or Firm* — Cowan, Liebowitz & Latman, P.C.

(57) ABSTRACT

A signal processing apparatus comprising: an analog-digital converter that uses reference signals having different slopes from each other; a supply unit that supplies analog signals of predetermined different output levels; and a calculation unit that calculates a slope ratio and an offset amount between the plurality of different slopes for correcting a converted digital signal based on digital signals respectively obtained by converting the analog signals of the different output levels using the reference signals. In a case where the conversion is performed using a reference signal with a steeper slope, the supply unit supplies at least one high level analog signal whose level is higher than a case where the conversion is performed using a reference signal with a gentler slope, and a digital signal obtained by converting the high level analog signal is further used when calculating the slope ratio.

11 Claims, 9 Drawing Sheets

(51) Int. Cl.
  *H04N 5/232* (2006.01)
  *H04N 5/357* (2011.01)
  *H04N 5/376* (2011.01)
  *H03M 1/52* (2006.01)
(52) U.S. Cl.
  CPC ............ *H04N 5/3765* (2013.01); *H03M 1/50* (2013.01); *H03M 1/52* (2013.01)
(58) Field of Classification Search
  CPC ... G09G 2320/0233; G09G 2320/0276; G09G 2320/0285; G09G 2320/0646; G09G 2320/0673; G09G 2340/16; G09G 2360/16; G09G 3/3233; G09G 3/3607
  USPC .................................................. 341/167–170
  See application file for complete search history.
(56) References Cited

U.S. PATENT DOCUMENTS

| | | | | |
|---|---|---|---|---|
| 8,350,941 B2* | 1/2013 | Kukita | ............... | H04N 5/23241 250/208.1 |
| 8,730,081 B2* | 5/2014 | Yang | ....................... | H04N 5/378 250/208.1 |
| 8,854,244 B2* | 10/2014 | Park | ....................... | H04N 5/355 341/169 |
| 8,878,954 B2* | 11/2014 | Hashimoto | ............ | H04N 5/225 341/155 |
| 9,041,579 B2* | 5/2015 | Meynants | ............... | H03M 1/34 341/128 |
| 2007/0194962 A1* | 8/2007 | Asayama | ............ | H03M 1/1014 341/144 |
| 2012/0086842 A1* | 4/2012 | Oike | ................... | H03M 1/1023 348/308 |
| 2015/0076325 A1* | 3/2015 | Higuchi | ................. | H04N 5/357 250/208.1 |
| 2015/0244388 A1* | 8/2015 | Hashimoto | ............. | H03M 1/34 348/322 |
| 2015/0350585 A1* | 12/2015 | Kim | ....................... | H04N 5/378 348/308 |

\* cited by examiner

SIGNAL PROCESSING APPARATUS AND SIGNAL PROCESSING METHOD, AND IMAGE CAPTURING APPARATUS

BACKGROUND OF THE INVENTION

Field of the Invention

The present invention relates to a signal processing apparatus and signal processing method, and image capturing apparatus, and particularly relates to a signal processing apparatus and signal processing method, and image capturing apparatus that perform analog-digital conversion.

Description of the Related Art

Recently, a common television standard has been changed from a television standard called "full high-definition", in which there are 1,920 horizontal pixels and 1,080 vertical pixels, to a television standard called "4K2K", in which there are 3,840 horizontal pixels and 2,160 vertical pixels, that are four times as much as pixels in a television standard called "high-definition". Further transitions to a next-generation television standard called "8K4K" ("ultra-high-definition"), in which there are 7,680 horizontal pixels and 4,320 vertical pixels, are expected in the future. As the number of pixels increases, framerates continue to increase as well.

The transition to such television standards has resulted in increased demand for more pixels and higher framerates in image capturing apparatuses that shoot video for television, and increasing the speed at which an image sensor for converting light into an electric signal reads out such video is an issue with respect to meeting such demand. To increase the readout speed, it is absolutely necessary to increase the processing speed of an AD converter provided in the image sensor.

On the other hand, in order to record a high-quality video, there is a demand for a higher number of bits of a video signal. However, in order to perform AD conversion with a high number of bits, the time required for AD conversion increases. Japanese Patent Laid-Open No. 2013-236362 discloses a technique in which an AD conversion is performed on a signal of a low level after amplifying the signal with a gain, a normal AD conversion is performed on a signal of a high level, and the levels of the AD-converted signals are corrected so as to compensate for the difference by the gain. In this manner, the number of bits is increased without increasing the time required for performing AD conversion.

However, in the above conventional example, there are cases where the correction error becomes an issue when correction is performed on signals that were AD-converted with different gains using a ramp signal and so forth. For example, in a case where noise or non-linear characteristics arise in an AD conversion circuit, the correction error becomes more conspicuous. Further, in a case where there are a plurality of changing points of gains, the correction error may become large depending on a changing point.

SUMMARY OF THE INVENTION

The present invention has been made in consideration of the above situation, and, in a case of performing analog-digital conversion using a plurality of ramp signals having different slopes, obtains a more appropriate correction value for correcting AD-converted values.

According to the present invention, provided is a signal processing apparatus comprising: an analog-digital converter that converts an analog signal to a digital signal using a plurality of reference signals having different slopes from each other; a supply unit that supplies analog signals of a plurality of predetermined different output levels; and a calculation unit that calculates a slope ratio and an offset amount between the plurality of different slopes for correcting a digital signal obtained by the analog-digital converter by converting an analog signal output from a pixel section of an image sensor based on a plurality of digital signals respectively obtained by converting the analog signals of the plurality of different output levels using the plurality of reference signals, wherein, in a case where the conversion is performed using a reference signal with a steeper slope, the supply unit supplies to the analog-digital converter at least one high level analog signal whose level is higher than a case where the conversion is performed using a reference signal with a gentler slope, and the calculation unit further uses a digital signal obtained by converting the high level analog signal when calculating the slope ratio.

Further, according to the present invention, provided is an image capturing apparatus comprising: an image sensor; an analog-digital converter that converts an analog signal to a digital signal using a plurality of reference signals having different slopes from each other; a supply unit that supplies analog signals of a plurality of predetermined different output levels; and a calculation unit that calculates a slope ratio and an offset amount between the plurality of different slopes for correcting a digital signal obtained by the analog-digital converter by converting an analog signal output from a pixel section of the image sensor based on a plurality of digital signals respectively obtained by converting the analog signals of the plurality of different output levels using the plurality of reference signals, wherein, in a case where the conversion is performed using a reference signal with a steeper slope, the supply unit supplies to the analog-digital converter at least one high level analog signal whose level is higher than a case where the conversion is performed using a reference signal with a gentler slope, and the calculation unit further uses a digital signal obtained by converting the high level analog signal when calculating the slope ratio.

Furthermore, according to the present invention, provided is a signal processing method, comprising: supplying analog signals of a plurality of predetermined different output levels to an analog-digital converter; converting the analog signals of a plurality of predetermined different output levels to digital signals using a plurality of reference signals having different slopes from each other by the analog-digital converter; and calculating a slope ratio and an offset amount between the plurality of different slopes for correcting a digital signal obtained by the analog-digital converter by converting an analog signal output from a pixel section of an image sensor based on the plurality of digital signals, wherein, in supplying the analog signals, in a case where the conversion is performed using a reference signal with a steeper slope, at least one high level analog signal whose level is higher than a case where the conversion is performed using a reference signal with a gentler slope is supplied to the analog-digital converter, and a digital signal obtained by converting the high level analog signal is used when calculating the slope ratio.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Exemplary embodiments of the present invention will be described in detail in accordance with the accompanying drawings.

First Embodiment

Figure 1:
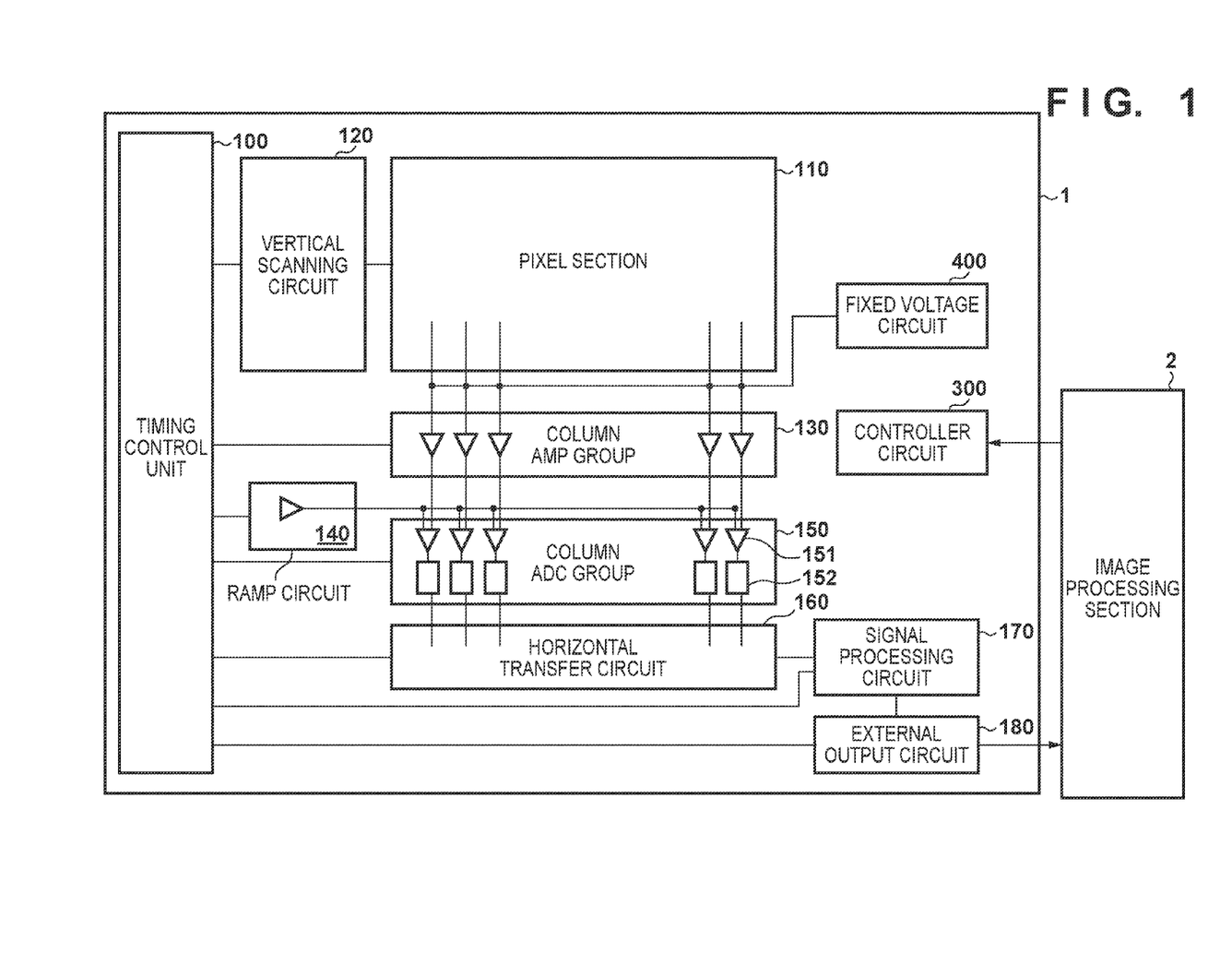
FIG. 1 is a block diagram illustrating the overall configuration of an image sensor used in an image capturing apparatus according to an embodiment of the present invention.

FIG. 1 is a block diagram illustrating the configuration of an image sensor 1 used in an image capturing apparatus according to a first embodiment of the present invention, and shows the image sensor 1 and an image processing section 2 that is an output destination for image data obtained by the image sensor 1. The image sensor 1 according to the first embodiment is a CMOS image sensor provided with a parallel-type AD converter. The image processing section 2 carries out developing processes such as white balance processing, gamma processing, and so on on the image data output by the image sensor 1, and ultimately records the data into a recording medium. The image processing section 2 includes a CPU, and the CPU communicates with (through serial communication, for example) and controls the image sensor 1 in accordance with an operating mode of the image capturing apparatus.

In the image sensor 1, a timing control unit 100 controls operations of the respective blocks in the image sensor 1 by supplying operational clock signals and timing signals thereto.

A pixel section 110 includes a plurality of pixels arranged two-dimensionally, and a charge obtained by a photoelectric conversion element in each pixel carrying out a photoelectric conversion in accordance with an incident light amount is converted into a voltage and output. Each pixel is provided with a color filter and a microlens. A Bayer array cyclic structure using what is known as an RGB primary color filter including R (red), G (green), and B (blue) is typically used as the color filter, but the color filter is not necessarily limited thereto.

A vertical scanning circuit 120 carries out timing control for sequentially reading out pixel signals obtained from the pixels in the pixel section 110 in a single frame period. The readout is generally carried out sequentially by row, starting from the top row in the frame and moving down the rows.

A column amp group 130 is constituted of a plurality of column amps provided in respective columns, and is used to electrically amplify the pixel signals read out from the pixel section 110. A S/N ratio with noise produced by a ramp circuit 140, a column analog-digital converter group (column ADC group) 150, and so on in later stages is improved by amplifying the pixel signals using the column amp group 130. However, the column amp group 130 is not absolutely necessary in a circuit structure where the noise produced by the ramp circuit 140, the column ADC group 150, and so on is sufficiently low relative to the noise produced by the pixel section 110.

A fixed voltage circuit 400 supplies a fixed voltage to signal lines that connect the pixel section 110 and the column amp group 130. Although the fixed voltage circuit 400 is used in the first embodiment, a circuit that can be applied as a clip circuit or the like that clips signals at a given constant voltage may be used as well.

The ramp circuit 140 is a signal generator that generates a ramp-shaped voltage signal (ramp signal) having a constant slope in the time direction. The column ADC group 150 has a column ADC constituted of a comparison unit 151 and a counter/latch circuit 152 in each column. The comparison unit 151 compares the pixel signal (analog signal) amplified by the column amp group 130 with the ramp signal from the ramp circuit 140 and outputs a signal indicating a size relationship between the signals. Then, by the counter/latch circuit 152 latching a counter value in accordance with the signal from the comparison unit 151, an analog-digital conversion is carried out. Details of the operations carried out by the comparison unit 151 and the counter/latch circuit 152 will be given later. One row's worth of digital image data held by the counter/latch circuit 152 is read out in order from an end of the row by a horizontal transfer circuit 160.

The image data read out by the horizontal transfer circuit 160 is input into a signal processing circuit 170. The signal processing circuit 170 is a circuit that processes signals digitally, and can easily carry out gain computations by carrying out shift computations, multiplication, and so on in addition to adding an offset value of a set amount through digital processes. A pixel region that is shielded from light (an OB pixel section) may be formed in the pixel section 110, and the signal processing circuit 170 may carry out a digital black level clamping operation using signals obtained from the pixels in the OB pixel section. Furthermore, the signal processing circuit 170 controls the ramp signal output from the ramp circuit 140 through the timing control unit 100 on the basis of input image data, as will be described later.

The image data processed by the signal processing circuit 170 is passed to an external output circuit 180. The external output circuit 180 has a serializer function, and converts multi-bit input parallel signals from the signal processing circuit 170 into a serial signal. The serial signal is converted into an LVDS signal or the like, for example, and is output to the image processing section 2.

A controller circuit 300 is an I/F unit with the image processing section 2, and handles control of the image sensor 1 from the CPU of the image processing section 2 using a serial communication circuit or the like.

Figure 2A:
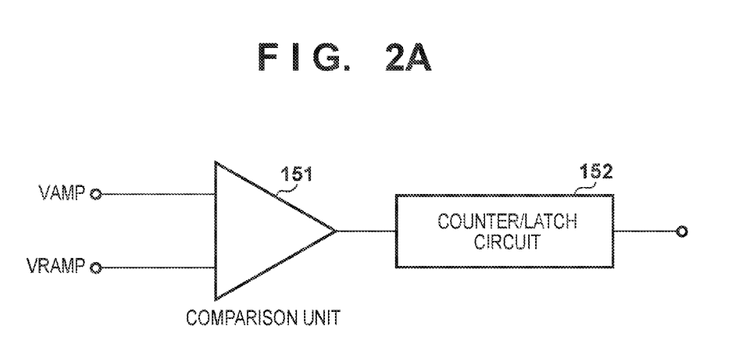
FIGS. 2A and 2B are diagrams illustrating the overall configuration and operational timing of a column amp group of the image sensor.

Next, the principles of a basic AD conversion using the column ADC group 150 of the image sensor 1 will be described using FIGS. 2A and 2B. As described above, the column ADC group 150 has the comparison unit 151 and the counter/latch circuit 152 in each column. Meanwhile, as illustrated in FIG. 2A, the comparison unit 151 compares a pixel signal VAMP output from the column amp group 130 with a ramp signal VRAMP output from the ramp circuit 140, and outputs a result of the comparison.

Figure 2B:
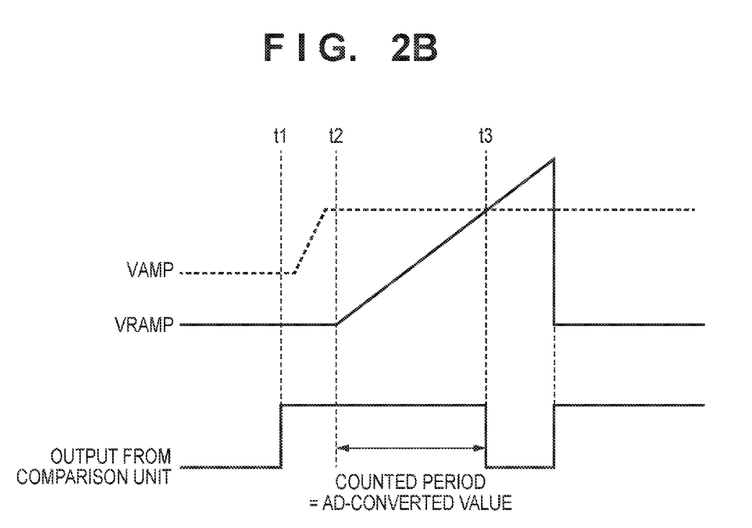

As indicated in FIG. 2B, the operations performed by the comparison unit 151 start before the start of the readout of the pixel signal VAMP from the pixel section 110 (time t1). When the operation of each column amp of the column amp group 130 stabilizes, a count value of the counter/latch circuit 152 is reset at time t2. The signal level of the ramp signal VRAMP output from the ramp circuit 140 increases as time passes following time t2, in synchronization with the count reset timing of the counter/latch circuit 152. The output of the comparison unit 151 inverts when the signal level of the ramp signal VRAMP output from the ramp circuit 140 exceeds the signal level of the pixel signal VAMP output from the column amp group 130 (time t3). The counter/latch circuit 152 carries out counting operations during a period from when the count value is reset to when the output of the comparison unit 151 inverts (from time t2 to time t3). A count value proportional to the output level of the pixel signal amplified by the column amp group 130 is obtained through these operations, and thus the count value obtained in this manner serves as an AD conversion result. Note that the method for comparing the pixel signal and the ramp signal, the method of counting performed by the counter/latch circuit, and so on described here are merely examples, and other methods may be employed as long as the period from when the count value is reset to when the output of the comparison unit 151 inverts can be detected.

Figure 3:
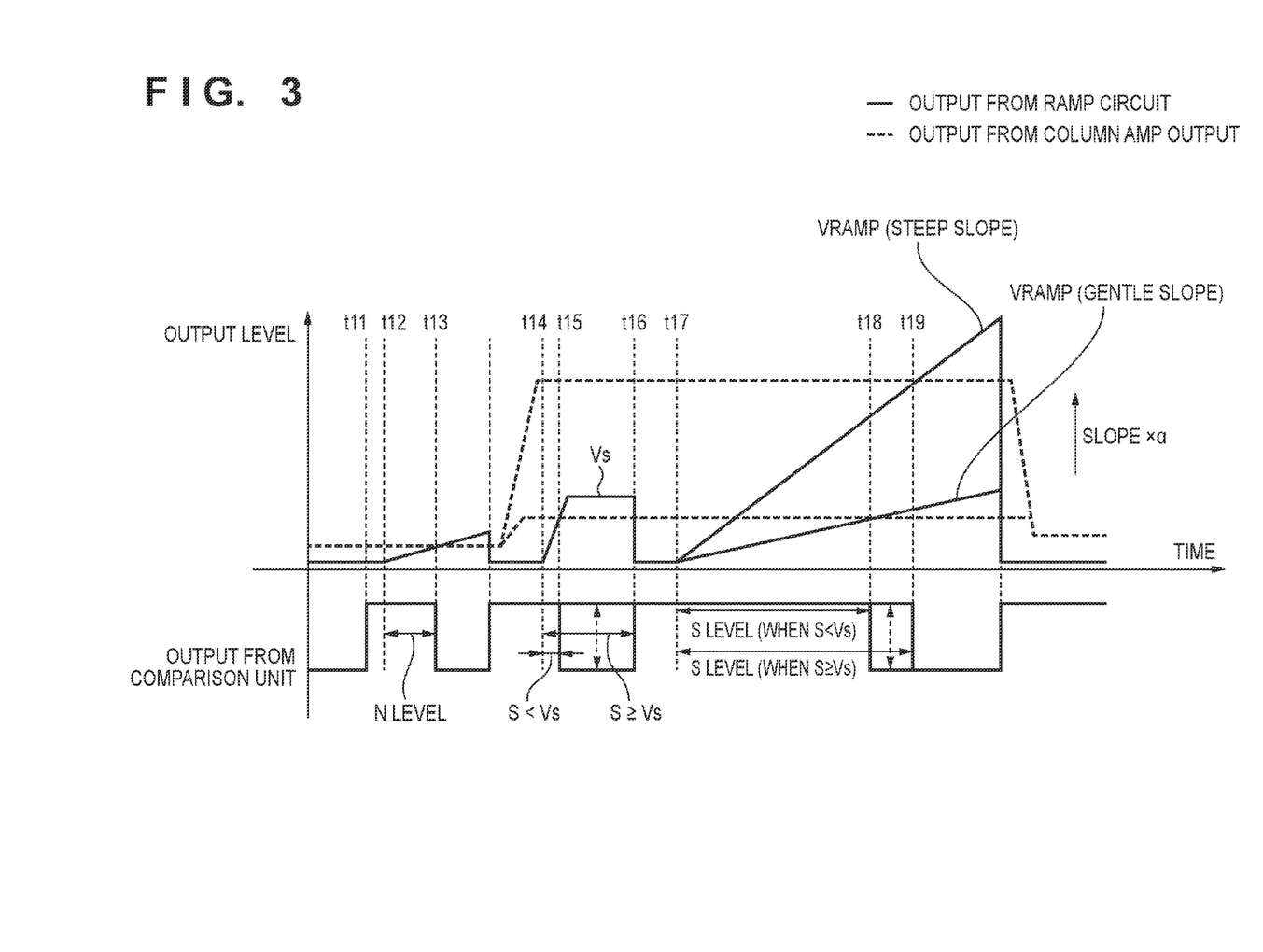
FIG. 3 is a timing chart illustrating AD conversion operations according to a first embodiment.

FIG. 3 is a diagram illustrating operations performed by the ramp circuit 140 and the column ADC group 150 according to the first embodiment. In FIG. 3, the abscissa represents time, the ordinate in the upper section of the graph represents an output level, and the lower section of the graph indicates the output of the comparison unit 151. An example in which the slope of the ramp signal VRAMP output from the ramp circuit 140 is changed in accordance with the signal level of the pixel signal VAMP from the column amp group 130 will be described with reference to FIG. 3.

Generally, in a process that reads out a signal from a unit pixel, an N signal (noise level) is first read out and AD-converted and an S signal (noise level+signal level) is then read out and AD-converted. A signal with good S/N is then obtained by finding a difference between the S signal and the N signal converted by the signal processing circuit 170 and cancelling the noise component.

First, to AD-convert the N signal, the operations of the comparison unit 151 are started at time t11, the count of the counter/latch circuit 152 is reset at time t12, and the signal level of the ramp signal VRAMP output from the ramp circuit 140 is changed. Here, the signal level of the N signal, which is the noise level, is low, and thus a first ramp signal VRAMP (gentle slope), which has a low slope, is used in the AD conversion of the N signal. The N signal is AD-converted by carrying out counting operations during a period from when the count of the counter/latch circuit 152 is reset to when the output of the comparison unit 151 inverts (from time t12 to time t13).

Next, in a level determination period, the ramp circuit 140 outputs, to the comparison unit 151, a determination ramp signal whose maximum level is a set determination level Vs, with respect to the S signal, which is an output signal obtained by reading out a signal corresponding to a charge accumulated in the pixel section 110 and amplifying the signal using the column amp group 130. This is then compared with the S signal. Here, at time t14, the count value of the counter/latch circuit 152 is reset and the ramp circuit 140 starts outputting the determination ramp signal having the predetermined determination level Vs as the maximum level. If the signal level of the S signal is greater than or equal to the determination level Vs (S≥Vs), the output of the comparison unit 151 does not invert, and thus the count value continues to increase until the level determination period ends at time t16. In contrast to this, if the signal level of the S signal is lower than the determination level Vs (S<Vs), the output of the comparison unit 151 inverts at time t15, for example, and thus the count value stops increasing. In this manner, the signal processing circuit 170 can determine whether the signal level of the S signal is lower or not lower than the determination level Vs from the count value of the counter/latch circuit 152. Note that the timing at which the count value of the counter/latch circuit 152 is reset may be taken as the point in time when the output of the ramp circuit 140 stabilizes at the determination level Vs and the count value may be controlled to 0 in the case where the signal level of the S signal is lower than the determination level Vs (S<Vs).

In the case where the signal level of the S signal is lower than the determination level Vs, the S signal is AD-converted using the same first ramp signal VRAMP (gentle slope) as the N signal from time t17. As a result, a count value between time t17 and time t18 is obtained, in the example indicated in FIG. 3. On the other hand, in the case where the signal level of the S signal is greater than or equal to the determination level Vs, the S signal is AD-converted using a second ramp signal VRAMP (steep slope) whose slope is a times that of the first ramp signal VRAMP (gentle slope). As a result, a count value between time t17 and time t19 is obtained, in the example indicated in FIG. 3.

Figure 4:
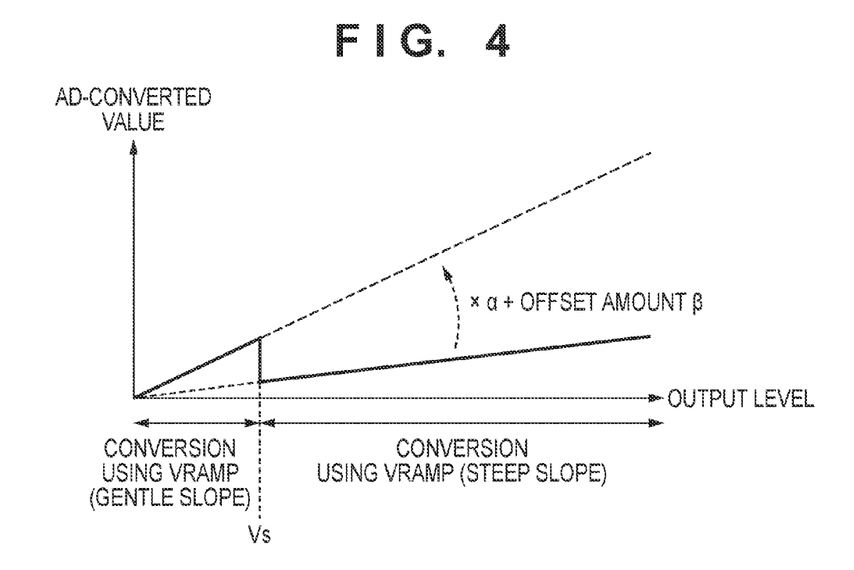
FIG. 4 is a diagram illustrating a relationship between an output level and an AD conversion result in the case of using ramp signals having different slopes depending on a signal level.

FIG. 4 is a diagram illustrating a relationship between the signal level of an output signal and an AD conversion result in the case of using ramp signals having different slopes depending on an output level. In FIG. 4, the abscissa represents an output signal level of the column amp group 130, and the ordinate represents a digital value obtained by AD-converting the S signal. The solid line represents the digital value (AD-converted value) AD-converted by the comparison unit 151 and the counter/latch circuit 152, and input into the signal processing circuit 170 through the horizontal transfer circuit 160. As described above, an S signal whose signal level is lower than the determination level Vs is AD-converted using the first ramp signal VRAMP (gentle slope), whereas an S signal whose signal level is greater than or equal to the determination level Vs is AD-converted using the second ramp signal VRAMP (steep slope). Accordingly, as illustrated in FIG. 4, the post-AD conversion S signal does not coincide before and after the determination level Vs.

Accordingly, first, the signal processing circuit 170 multiplies the AD-converted value of the S signal whose signal level is higher than the determination level Vs by a ratio α between the slopes of the first ramp signal VRAMP (gentle slope) and the second ramp signal VRAMP (steep slope). Furthermore, the signal level of the pixel signal corresponding to the incident light amount and the AD-converted value are corrected to a first order relationship by adding an offset amount β (Formula (1)) in order to eliminate a gap at the determination level Vs.

$$(\text{expected AD-converted value using the first ramp signal}) = \alpha \times (\text{AD-converted value obtained using the second ramp signal}) + \beta \quad (1)$$

If a video from effective pixels is output in a state where the aforementioned correction is not carried out, an unnatural video in which gaps remain at a given brightness will result. An ideal target correction value changes depending on the temperature of the image sensor, the driving timing of the image sensor (the gain, operation state, and so on of the column amp group 130), and driving settings (power source settings and the like), and thus it is necessary to obtain the correction value immediately before shooting an image or to obtain the correction value regularly.

Next, an example of a method for calculating the ratio α between the first ramp signal VRAMP (gentle slope) and the second ramp signal VRAMP (steep slope), and the offset amount β will be described.

Figure 5:
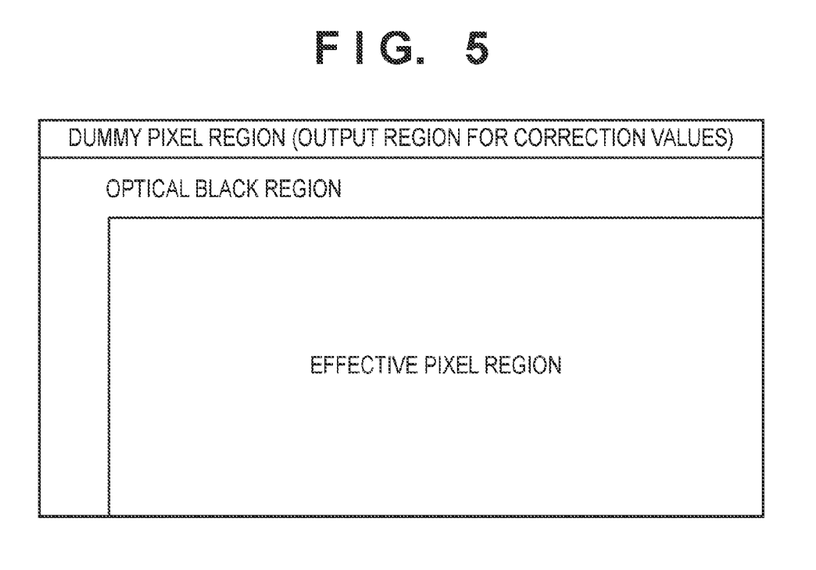
FIG. 5 is a diagram illustrating an example of the configuration of a pixel section of the image sensor according to the first embodiment.

FIG. 5 illustrates an example of the configuration of the pixel section 110. In this pixel configuration, a dummy pixel region lacking photodiodes is provided in the uppermost area, and an optical black (OB) region that is shielded from light and an effective pixel region that output signals obtained through photoelectric conversion are arranged in that order therebelow. In the first embodiment, pixel signals from the dummy pixels are used for calculating the ratio α between the slopes and the offset amount β. Here, control is carried out so that the fixed voltage from the fixed voltage circuit 400 is input in a pixel signal readout period for the dummy pixels, and the voltage input into the comparison unit 151 from the column amp group 130 reaches a given fixed voltage. Note that the voltages V1, V2 and V3 are used as the fixed voltage in the first embodiment.

Figure 6A:
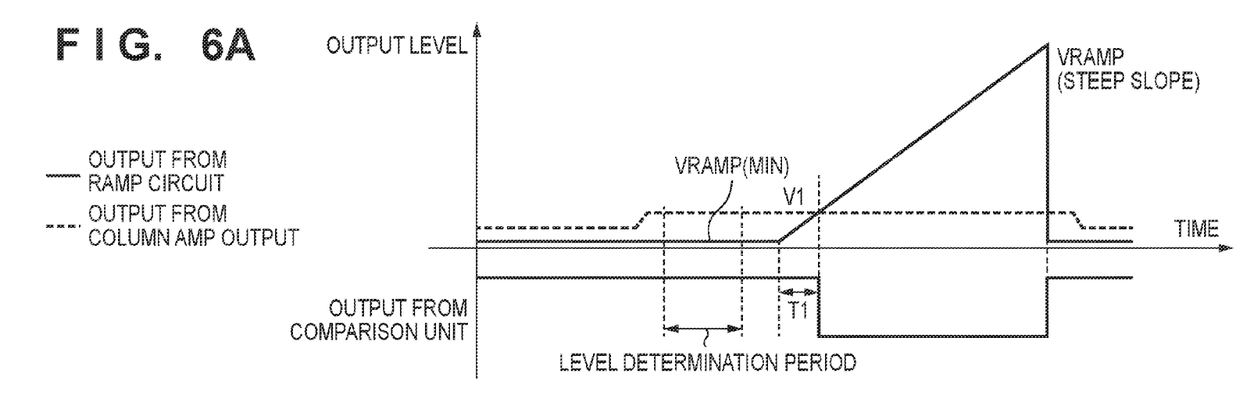
FIG. 6A is a timing chart for a case where a fixed voltage V1 is AD-converted using a second ramp signal VRAMP (steep slope) in a dummy pixel readout period according to the first embodiment.

An AD conversion process carried out in the dummy pixel readout period will be described with reference to FIGS. 6A to 6D. In FIG. 6A, the fixed voltage V1 is AD-converted. Note that unlike the process described with reference to FIG. 3, it is not necessary to provide a period for AD-converting the N signal. As illustrated in FIG. 6A, the fixed voltage V1 is AD-converted using the second ramp signal VRAMP (steep slope), whose slope is high, by raising the ramp signal VRAMP output from the ramp circuit 140 during the level determination period to a minimum value VRAMP(MIN). The result of the AD conversion is represented by T1.

Figure 6B:
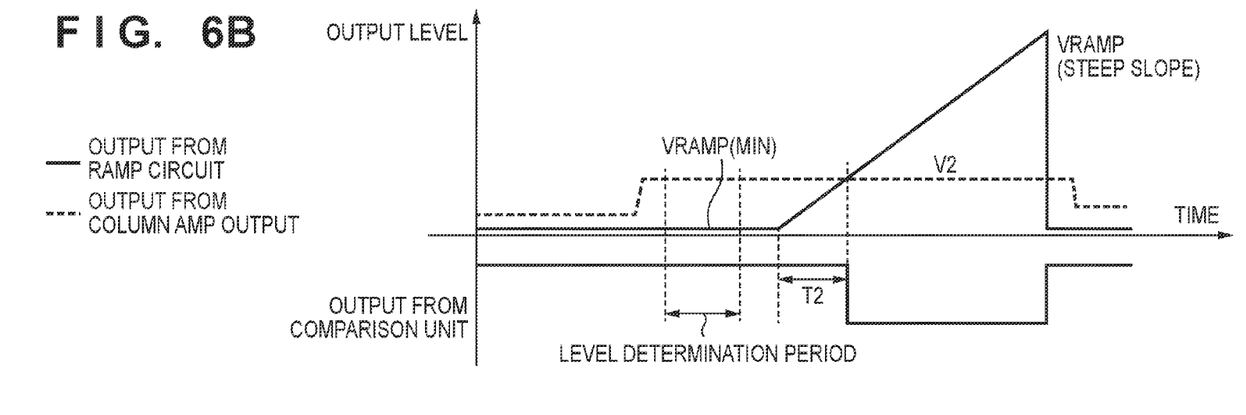
FIG. 6B is a timing chart for a case where the fixed voltage V2 is AD-converted using the second ramp signal VRAMP (steep slope) in a dummy pixel readout period according to the first embodiment.

Next, as illustrated in FIG. 6B, the fixed voltage V2 which is larger than the fixed voltage V1 is AD-converted. Here, the fixed voltage V2 may be set as the same voltage as the determination level Vs. In FIG. 6B, too, the fixed voltage V2 is AD-converted using the second ramp signal VRAMP (steep slope), whose slope is high, by setting the ramp signal VRAMP during the level determination period to the minimum value VRAMP(MIN). The result of the AD conversion is represented by T2.

Figure 6C:
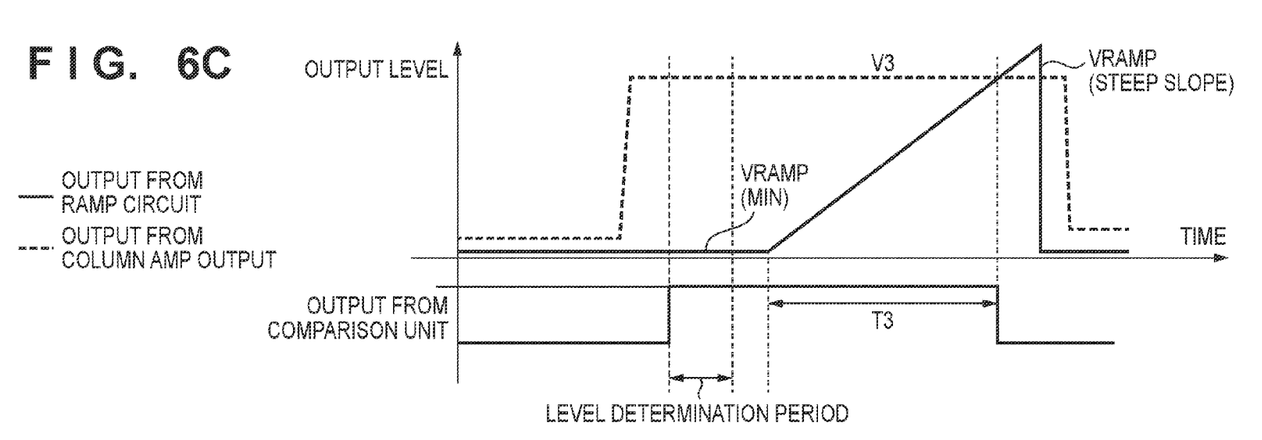
FIG. 6C is a timing chart for a case where a fixed voltage V3 is AD-converted using the second ramp signal VRAMP (steep slope) in a dummy pixel readout period according to the first embodiment.

Similarly, as illustrated in FIG. 6C, the fixed voltage V3 which is larger than the fixed voltage V2 is AD-converted. In FIG. 6C, too, the fixed voltage V3 is AD-converted using the second ramp signal VRAMP (steep slope), whose slope is high, by setting the ramp signal VRAMP during the level determination period to the minimum value VRAMP(MIN). The result of the AD conversion is represented by T3.

Figure 6D:
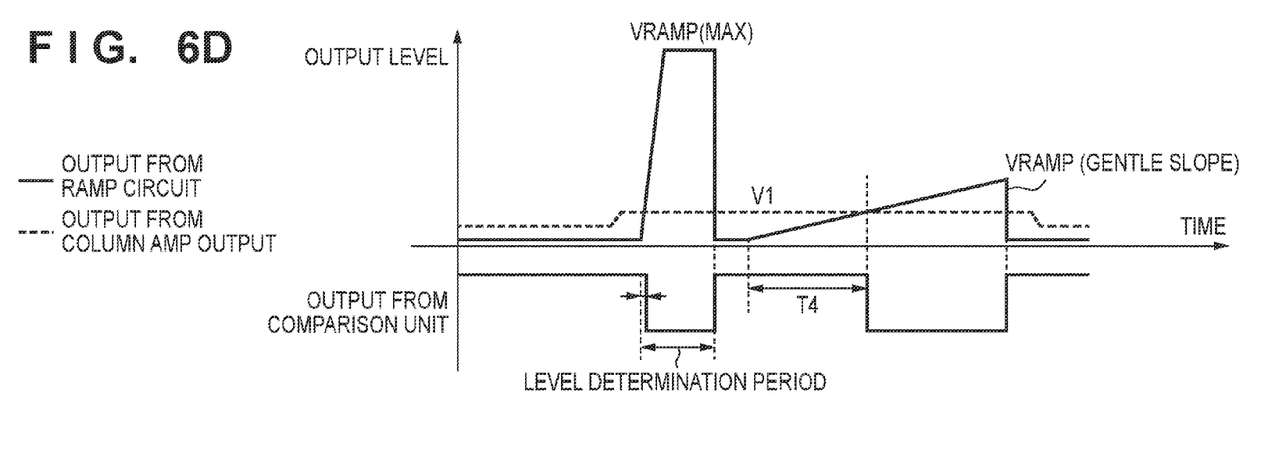
FIG. 6D is a timing chart for a case where the fixed voltage V1 is AD-converted using a first ramp signal VRAMP (gentle slope) in a dummy pixel readout period according to the first embodiment.

Next, as illustrated in FIG. 6D, the fixed voltage V1 is AD-converted. In FIG. 6D, the fixed voltage V1 is AD-converted using the first ramp signal VRAMP (gentle slope), whose slope is low, by setting the ramp signal VRAMP during the level determination period to a maximum value VRAMP(MAX). The result of the AD conversion is represented by T4.

Figure 6E:
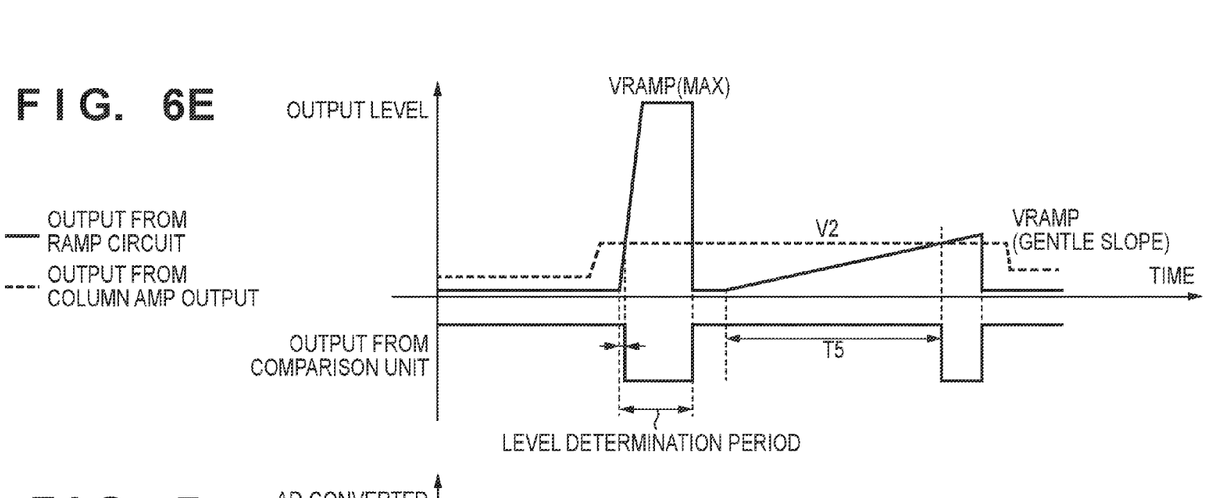
FIG. 6E is a timing chart for a case where the fixed voltage V1 is AD-converted using the first ramp signal VRAMP (gentle slope) in a dummy pixel readout period according to the first embodiment.

Lastly, as illustrated in FIG. 6E, the fixed voltage V2 is AD-converted. In FIG. 6E, too, the fixed voltage V2 is AD-converted using the first ramp signal VRAMP (gentle slope), whose slope is low, by setting the ramp signal VRAMP during the level determination period to the maximum value VRAMP(MAX). The result of the AD conversion is represented by T5.

Figure 7:
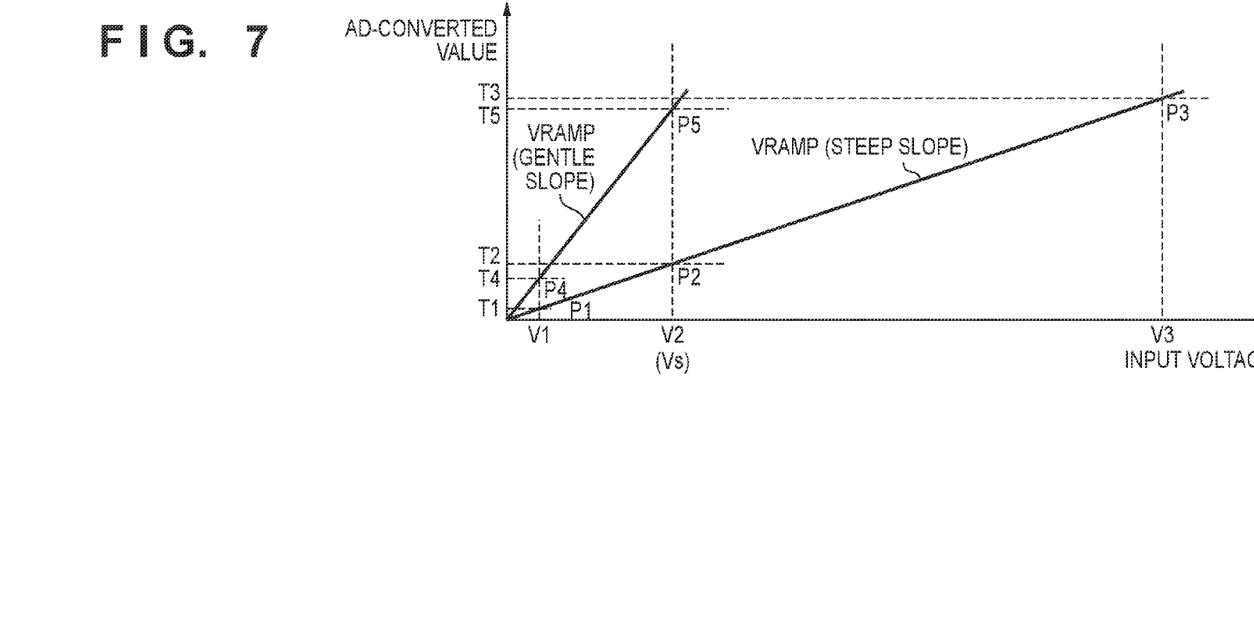
FIG. 7 is a diagram showing reference points to be based on to generate correction values according to the first embodiment.

This is represented as illustrated in FIG. 7, when the fixed voltages V1, V2 and V3 are shown by the abscissa representing an input voltage and the ordinate represents the AD-converted value. The AD-converted values of the fixed voltages V1, V2 and V3 are obtained using the second ramp signal VRAMP (steep slope), and the AD-converted values of the fixed voltages V1 and V2 are obtained using the first ramp signal VRAMP (gentle slope).

The slope ratio α and the offset amount β can be found from the five coordinate points T1 to T5, obtained as above, as will be explained below.

First, the slope ratio α is calculated from a ratio between two slopes, one is a slope between two wide-apart points (P1 and P3 in FIG. 7) on the second ramp signal VRAMP (steep slope) and the other is a slope between two wide-apart points (P4 and P5 in FIG. 7) on the first ramp signal VRAMP (gentle slope). For example, the following Formula (2) is used.

$$\alpha = \frac{(T5 - T4)(V3 - V1)}{(V2 - V1)(T3 - T1)} \quad (2)$$

Next, the offset amount β is calculated based on two points (P2 and P5 in FIG. 7) that correspond to the fixed voltage V2, which is the same as the determination level Vs, used as a reference voltage. For example, the following Formula (3) is used.

$$\beta = T5 - \frac{(T5 - T4)(V3 - V1)}{(V2 - V1)(T3 - T1)} T2 \quad (3)$$

The correction values α and β may be calculated within the image sensor 1 or in the image processing section 2.

With regard to the Formula (2), since the slope ratio α is calculated using the AD-converted values T1 and T3 of the fixed voltages V1 and V3 using the second ramp signal VRAMP (steep slope), the correction accuracy increases comparing to a case of using the fixed voltages V1 and V2, for example. In a case where the slope is calculated using the AD-converted values T1 and T2 of the fixed voltages V1 and V2, if there is an error ΔV at the time of AD-converting the fixed voltage V2, the error of a calculated slope is expressed by ΔV/(V2−V1). On the other hand, in a case where the slope is calculated using the AD-converted values T1 and T3 of the fixed voltages V1 and V3, if there is an error ΔV at the time of AD-converting the fixed voltage V3, the error of a calculated slope is expressed by ΔV/(V3−V1). Since V3 is larger than V2, ΔV/(V3−V1) is smaller than ΔV/(V2−V1). Here, the error may be caused by noise and non-linear characteristics that occurs at the time of AD conversion. By reducing the correction error, it is possible to reduce the fluctuation in output data level after correction.

Further, with regard to the Formula (3), the offset amount β is found on the basis of the two points P2 and P5. Therefore, a difference between an AD-converted value that is obtained by AD-converting an input voltage which is slightly smaller than the determination level Vs using the first ramp signal VRAMP (gentle slope) and a product of a correction value and an AD-converted value that is obtained by AD-converting an input voltage which is slightly larger than the determination level Vs using the second ramp signal VRAMP (steep slope) becomes smaller compared to a case where the offset amount β is calculated based on other points. In other words, a gap between the AD-converted values is reduced when an amount of input light changes and the ramp signal is switched.

Further, in this embodiment, one of the ramp signals having different slopes is selectively used depending upon the signal level of an input pixel signal, it is possible to secure a more appropriate dynamic range comparing to a case where the AD conversion is performed using one kind of ramp signal. For example, it is possible to prevent such a situation that, when the AD conversion is performed using one kind of ramp signal, obtained AD-converted values of the whole image may be smaller than expected, and the dynamic range of the image after AD-conversion is narrow. Conversely, it is possible to prevent such a situation that, when an image is bright, obtained AD-converted values are larger than expected and proceed the dynamic range.

According to the first embodiment as described above, in a case of performing AD conversion using a plurality of ramp signals having different slopes, it is possible to reduce an error of slopes for calculating correction values for correcting AD-converted values, as well as reduce a gap between the AD converted values of input signals around the determination level Vs.

Second Embodiment

Next, the second embodiment of the present invention will be explained. In the second embodiment, an example of using a first correction value generation method and a second correction value generation method will be explained. The first correction value generation method is a method using the Formulae (2) and (3) explained in the first embodiment, and thus, explanation of it is omitted here.

The second correction value generation method will be explained below with reference to FIG. 7. First, the slope ratio α is found using the two points (P2 and P5), obtained by AD converting the fixed voltage V2 that is the same level as the determination level Vs, and the two points (P1 and P4) obtained by AD converting the fixed voltage V1 that is smaller than the fixed voltage V2. The following Formula (4) is used, for example.

$$\alpha = \frac{T5 - T4}{T2 - T1} \quad (4)$$

Next, the offset amount β is calculated also using the same four points (P1, P2, P4 and P5) as used in calculating the slope ratio α. The following Formula (5) is used, for example.

$$\beta = \frac{T2T4 - T1T5}{T2 - T1} \quad (5)$$

Figure 8:
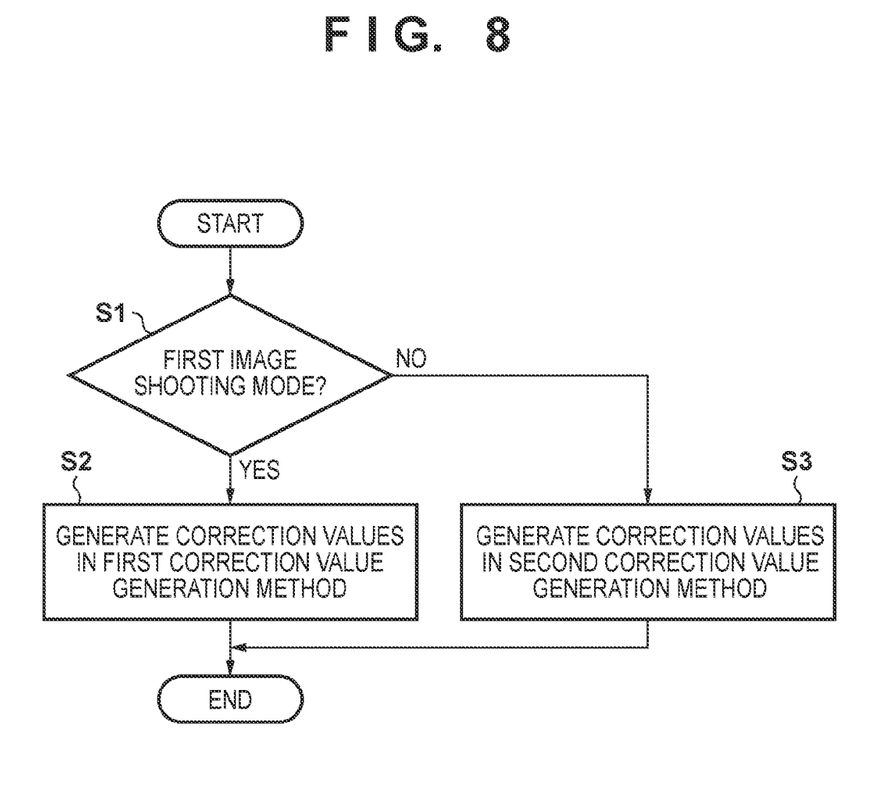
FIG. 8 is a flowchart of changeover processing of correction value generation methods according to a second embodiment.

FIG. 8 is a flowchart of changeover processing of the correction value generation methods according to the second embodiment. In step S1, whether or not a first image shooting mode is set is determined. The first image shooting mode is a mode that uses the second ramp signal VRAMP (steep slope) in a case where a pixel signal amplified by the column amp group 130 is equal to or greater than the determination level Vs, and uses the first ramp signal VRAMP (gentle slope) in a case where the pixel signal is smaller than the determination level Vs. A second image shooting mode is a mode that uses the second ramp signal VRAMP (steep slope) in a case where the pixel signal is equal to or greater than the determination level Vs, and switches between the first ramp signal VRAMP (gentle slope) and the second ramp signal VRAMP (steep slope) in a case where the pixel signal is smaller than the determination level Vs.

The first image shooting mode or the second image shooting mode is set by a user by selecting from a menu screen displayed on a display unit (not shown). It should be noted that the present invention is not limited to this example, and the first image shooting mode or the second image shooting mode may be set automatically in accordance with an arbitrary condition. Further, in the second image shooting mode, in a case where appropriate correction values are calculated (for example, in a case where the reliability of calculated correction values is higher than a predetermined reliability), AD conversion is performed using the first ramp signal VRAMP (gentle slope). On the contrary, in a case where an appropriate correction value cannot be calculated (for example, in case where the reliability of a calculated correction value is not higher than the predetermined value), AD conversion is performed using the second ramp signal VRAMP (steep slope).

As an example of a situation where an appropriate correction value cannot be calculated, a predetermined period since a gain of the column amp group 130 is changed is conceivable. An appropriate correction value cannot be calculated for a while since the gain is changed because an AD-converted values of a pixel signal corresponding to a given quantity of light before and after the gain is changed are different. In such case, AD conversion is performed using the second ramp signal VRAMP (steep slope) even if an output signal from the column amp group 130 is less than the determination level Vs. In this case, AD conversion is performed using the second ramp signal VRAMP (steep slope) regardless of the level of the output signal from the column amp group 130, it is unnecessary to correct the AD-converted value.

If it is determined in step S1 that the first image shooting mode is set, the process proceeds to step S2. In step S2, correction values to be used at the time of AD conversion are found using the first correction value generation method.

On the other hand, if it is determined in step S1 that the second image shooting mode is set, the process proceeds to step S3. In step S3, correction values to be used at the time of AD conversion are found using the second correction value generation method.

For example, since the first image shooting mode is set in step S2, a case where the first ramp signal VRAMP (gentle slope) and the second ramp signal VRAMP (steep slope) are changed is only when a pixel signal crosses over the determination level Vs. At this time, the AD-converted values are corrected so as to coincide with each other around the determination level Vs (FIG. 9B), it is possible to minimize a level gap generated at the time of changing the ramp signals. Further, as the slope ratio of the ramp signals is calculated based on wide range of the quantities of incident light, the effects of noise and non-linear characteristics can be minimized.

Figure 9A:
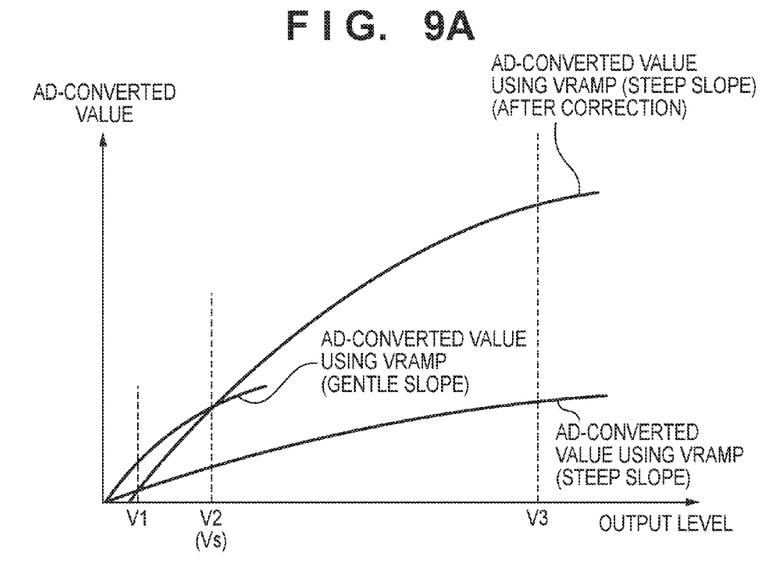
FIGS. 9A and 9B are diagrams illustrating AD-converted values after correction according to the second embodiment.
Figure 9B:
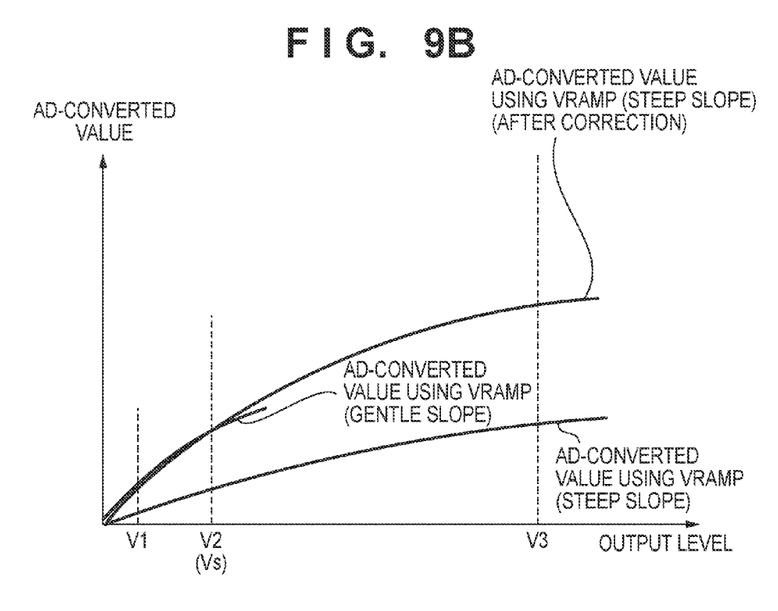

On the other hand, in step S3, in a case where a pixel signal is less than the determination level Vs, there is a possibility that the first ramp signal VRAMP (gentle slope) and the second ramp signal VRAMP (steep slope) are changed regardless of the signal level. In such case, correction is performed so that AD-converted values coincide with each other at two points that correspond to a large signal level and a small signal level of pixel signals below the determination level Vs (FIG. 9A). Accordingly, wherever of a signal level of a pixel signal below the determination level Vs the ramp signals are changed, it is possible to minimize the level gap that may be caused.

According to the second embodiment as described above, it is possible to realize an appropriate image shooting by properly using either of two correction value generation methods depending upon the situation.

It should be noted that, in the above first and second embodiments, it is described that either the first ramp signal VRAMP (gentle slope) or the second ramp signal VRAMP (steep slope) is selected. However, the present invention is not limited to this, and a plurality of determination levels may be set, and any of three or more ramp signals may be selected.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. Further, parts of the above embodiments may be appropriately combined.

This application claims the benefit of Japanese Patent Application No. 2016-040441, filed on Mar. 2, 2016 which is hereby incorporated by reference herein in its entirety.

What is claimed is:

1. A signal processing apparatus comprising:
   an analog-digital converter that converts an analog signal to a digital signal using a plurality of reference signals having different slopes from each other;
   a supply unit that supplies analog signals of a plurality of predetermined different output levels; and
   a calculation unit that calculates a slope ratio and an offset amount between the plurality of different slopes for correcting a digital signal obtained by the analog-digital converter by converting an analog signal output from a pixel section of an image sensor based on a plurality of digital signals respectively obtained by converting the analog signals of the plurality of different output levels using the plurality of reference signals,
   wherein, in a case where the conversion is performed using a reference signal with a steeper slope, the supply unit supplies to the analog-digital converter at least one high level analog signal whose level is higher than a case where the conversion is performed using a reference signal with a gentler slope, and
   the calculation unit further uses a digital signal obtained by converting the high level analog signal when calculating the slope ratio.

2. The signal processing apparatus according to claim 1, wherein the plurality of reference signals include a first reference signal and a second reference signal whose slope is steeper than the first reference signal,
   the supply unit further supplies the high level analog signal in a case where the conversion is performed using the second reference signal, and
   the calculation unit further uses a digital signal obtained by converting the high level analog signal to calculate the slope ratio between the first reference signal and the second reference signal.

3. The signal processing apparatus according to claim 2, wherein the analog-digital converter performs the conversion using the first reference signal in a case where a signal level of the analog signal output from the pixel section of the image sensor is smaller than a predetermined threshold, and performs the conversion using the second reference signal in a case where a signal level of the analog signal is equal to or greater than a predetermined threshold.

4. The signal processing apparatus according to claim 2, wherein the analog-digital converter performs the conversion either in:
   a first image shooting mode in which, in a case where a signal level of an analog signal output from the pixel section of the image sensor is less than a predetermined threshold, the analog signal is converted using the first reference signal and, in a case where the signal level is equal to or greater than the threshold, the analog signal is converted using the second reference signal; or
   a second image shooting mode in which, in a case where a signal level of an analog signal output from the pixel section of the image sensor is less than a predetermined threshold, the analog signal is converted using the first reference signal or the second reference signal depending on a predetermined condition and, in a case where the signal level is equal to or greater than the threshold, the analog signal is converted using the second reference signal.

5. The signal processing apparatus according to claim 4, wherein the predetermined condition includes whether or not reliability of the slope ratio and the offset amount calculated by the calculation unit is higher than a predetermined reliability, and
   in the second image shooting mode, the analog-digital converter performs the conversion using the first reference signal in a case where the signal level is less than the threshold and the reliability is higher than the predetermined reliability, and performs the conversion using the second reference signal in a case where the signal level is less than the threshold and the reliability is equal to or less than the predetermined reliability.

6. The signal processing apparatus according to claim 5, wherein the analog-digital converter includes an amplifier that applies a gain to an input analog signal, and
   in a case where the gain of the amplifier is changed, it is determined that the reliability is not higher than the predetermined reliability.

7. The signal processing apparatus according to claim 4, wherein, in the second image shooting mode, the calculation unit calculates the slope ratio and the offset amount without using the digital signal obtained by converting the high level analog signal.

8. The signal processing apparatus according to claim 1, wherein the pixel section of the image sensor has dummy pixels which do not include photoelectric converters, and the supply unit supplies the analog signals of the plurality of predetermined different output levels during a readout period of the dummy pixels.

9. The signal processing apparatus according to claim 1, wherein the analog-digital converter is provided for each column of the pixel section of the image sensor.

10. An image capturing apparatus comprising:
an image sensor;
an analog-digital converter that converts an analog signal to a digital signal using a plurality of reference signals having different slopes from each other;
a supply unit that supplies analog signals of a plurality of predetermined different output levels; and
a calculation unit that calculates a slope ratio and an offset amount between the plurality of different slopes for correcting a digital signal obtained by the analog-digital converter by converting an analog signal output from a pixel section of the image sensor based on a plurality of digital signals respectively obtained by converting the analog signals of the plurality of different output levels using the plurality of reference signals,
wherein, in a case where the conversion is performed using a reference signal with a steeper slope, the supply unit supplies to the analog-digital converter at least one high level analog signal whose level is higher than a case where the conversion is performed using a reference signal with a gentler slope, and
the calculation unit further uses a digital signal obtained by converting the high level analog signal when calculating the slope ratio.

11. A signal processing method, comprising:
supplying analog signals of a plurality of predetermined different output levels to an analog-digital converter;
converting the analog signals of a plurality of predetermined different output levels to digital signals using a plurality of reference signals having different slopes from each other by the analog-digital converter; and
calculating a slope ratio and an offset amount between the plurality of different slopes for correcting a digital signal obtained by the analog-digital converter by converting an analog signal output from a pixel section of an image sensor based on the plurality of digital signals,
wherein, in supplying the analog signals, in a case where the conversion is performed using a reference signal with a steeper slope, at least one high level analog signal whose level is higher than a case where the conversion is performed using a reference signal with a gentler slope is supplied to the analog-digital converter, and
a digital signal obtained by converting the high level analog signal is used when calculating the slope ratio.

* * * * *